United States Patent
Quintanar et al.

(10) Patent No.: US 6,448,857 B1
(45) Date of Patent: Sep. 10, 2002

(54) AUDIO AMPLIFIER CONTROLLER HAVING SOFT START CIRCUIT PROTECTION AND ASSOCIATED METHODS

(75) Inventors: Felix Clarence Quintanar; Juan Humberto Organvidez, both of Miami, FL (US)

(73) Assignee: Niles Audio Corporation, Miami, FL (US)

( * ) Notice: Subject to any disclaimer, the term of this patent is extended or adjusted under 35 U.S.C. 154(b) by 0 days.

(21) Appl. No.: 09/548,961

(22) Filed: Apr. 13, 2000

(51) Int. Cl.[7] .................................................. H03F 1/52
(52) U.S. Cl. ........................................ 330/289; 330/298
(58) Field of Search .............................. 330/51, 207 P, 330/289, 298; 381/120

(56) References Cited

U.S. PATENT DOCUMENTS 5,532,649 A * 7/1996 Sahyoun ..................... 330/297
5,767,744 A * 6/1998 Irwin et al. ................. 330/297

* cited by examiner

Primary Examiner—Steven J. Mottola
(74) Attorney, Agent, or Firm—Lott & Friedland, P.A.

(57) ABSTRACT

An audio amplifier power and temperature controller and associated methods are provided. The controller preferably includes a power receiving circuit positioned to receive power from a power source to an audio amplifier and a power condition switching control circuit responsive to the power receiving circuit to switch components of an audio amplifier during a plurality of power conditions. The power condition switching control circuit preferably includes a soft start circuit responsive to the power receiving circuit to limit inrush current from the power receiving circuit and to slowly ramp up to an audio amplifier on-state and a thermal status monitoring and controlling circuit to monitor thermal status of operating values of audio amplifier components and responsively decrease power to the audio amplifier components to protect the audio amplifier components against damage caused by excess heat and responsively increase power when the audio amplifier components return to normal thermal operating conditions.

18 Claims, 17 Drawing Sheets

AUDIO AMPLIFIER CONTROLLER HAVING SOFT START CIRCUIT PROTECTION AND ASSOCIATED METHODS

FIELD OF THE INVENTION

The present invention relates to the stereo and audio industries and, more particularly, to the field of audio amplifiers for amplifying audio and related methods.

BACKGROUND OF THE INVENTION

Over the years, the stereo and audio industries have grown dramatically. As additional capabilities of the various audio and stereo equipment has advanced, a continual cost pressure of new equipment from consumers and the increased worldwide competition has forced prices to down over the years for audio and stereo equipment. This audio and stereo equipment, for example, includes audio amplifiers, power boosters, power supplies, receivers, transmitters, radios, clocks, tuners, speakers, tape, compact disc, and various players, and various other equipment as understood by those skilled in the art.

In the power audio amplifier field, however, many advancements have focused on improved techniques for generation of high acoustic power and yet have high bandwidth and low distortion. Also, improvements have been made in providing power or supplying power to audio amplifiers. These power amplifiers conventionally use two different power sources. One from a high voltage source and another from a low voltage source. A switching transistor is often used to change between the low and high voltage sources. The audio signal applied to the speaker is detected, and when the level of audio signal exceeds a preselected level, the switching transistor is so turned as to supply power from the high voltage source. When the level of the audio signal is below the preselected level, the switching transistor is so turned as to supply power from the low voltage source. High levels of power, especially for long periods of time or in very high surges, can overheat and severely damage the transistors and many of the other electronic components of these audio amplifiers.

To address some of these problems, power amplifiers have been developed with temperature controls which attempt to prevent the transistors and other electronic components from overheating. Examples of such power amplifiers can be seen in U.S. Pat. No. 5,818,301 by Higashiyama et al. titled "Power Amplifier Arrangement Of A Plural Power Supply Switching Type" and U.S. Pat. No. 5,331,291 by D'Agostino et al. titled "Circuit And Method For Adjusting The Bias Of An Amplifier Based Upon Load Current And Operating Temperature." Such power amplifiers, however, fail to take into account power surges which can arise, particularly in start up, which can quickly damage the transistors and other electronic components.

To address these power surge problems, circuits have been developed which detect abnormal voltage levels and cut off portions of a power amplifier circuit. An example of such a circuit can be seen in U.S. Pat. No. 5,847,610 by Fujita titled "Protection Circuit For An Audio Amplifier." Such power circuits do little to address start up problems and do little to discriminate or recognize true or false power surge problems.

SUMMARY OF THE INVENTION

With the foregoing in mind, the present invention advantageously provides an audio amplifier controller for an audio amplifier and associated methods which limits in-rush current during start up and slowly ramps up to a high power and amplifier state. The present invention also advantageously provides an audio amplifier controller which in combination allows for soft start capabilities, power discrimination capabilities, and thermal monitoring capabilities to enhance protection for power audio amplifiers during various power surge and temperature increasing conditions. The present invention additionally advantageously provides an audio amplifier controller which monitors the current output of the amplifier to protect speakers or other devices by disconnecting the load to the output circuits during high current conditions and then continues to monitor the current output to resume normal conditions if desirable. The present invention yet also provides an audio amplifier controller for an audio amplifier which protects the amplifier from going into and remaining in a circuit protection mode by continuously monitoring for normal current conditions. The present invention further advantageously provides an audio amplifier having an audio controller and associated methods which detects voltage level changes by frequency changes and voltage nulls. The present invention still further provides an alternating current soft start circuit which advantageously limits inrush current and allows a slow ramp up of power to a high power on-state by sensing frequency and voltage nulls.

More particularly, the present invention provides an audio amplifier power and temperature controller which preferably includes power receiving means for receiving power from a power source to an audio amplifier and power condition switching control means responsive to the power receiving means for switching components of an audio amplifier during a plurality of power conditions. The power condition switching control means preferably includes soft starting means responsive to the power receiving means for limiting inrush current from the power receiving means and for slowly ramping up to an audio amplifier on-state, thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions, and output monitoring means for monitoring current output circuits of the audio amplifier to protect an audio amplifier during a high current condition when connected to the audio amplifier by disconnecting a load to the current output circuits and reconnecting the load to the current output circuits when normal operating current conditions resume.

The present invention additionally includes a alternating current ("AC") soft starting circuit which preferably has a power level detecting circuit responsive to an alternating current source and positioned to detect voltage changes by sensing frequency changes and voltage null points and a micro-controller responsive to the power level detection circuit to monitor low power conditions and high power conditions to limit inrush current during high power condition from the alternating current source and to slowly ramp up to high power on-state condition. The AC soft start circuit can also include the micro-controller having wave analyzing means for analyzing sinusoidal waves of the alternating current source detected by the power level detection circuit to determine a voltage null so that the soft start function allows a power on-state to be initiated just prior to a voltage null and to gradually ramp up to a the high power on-state condition.

The present invention also includes methods of controlling power to an audio amplifier. A method preferably includes receiving power from a power source to an audio amplifier and switching components of an audio amplifier during a plurality of power conditions. The step of switching components preferably includes limiting inrush current from the power source, slowly ramping up to an audio amplifier on-state, monitoring thermal status of operating values of audio amplifier components, responsively decreasing power to the audio amplifier components to protect the audio amplifier components against damage caused by excess heat, and responsively increasing power when the audio amplifier components return to normal thermal operating conditions.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF PREFERRED EMBODIMENTS

The present invention will now be described more fully hereinafter with reference to the accompanying drawings which illustrated preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime and/or double prime notation are used to indicate similar elements in alternative embodiments.

Figure 1:
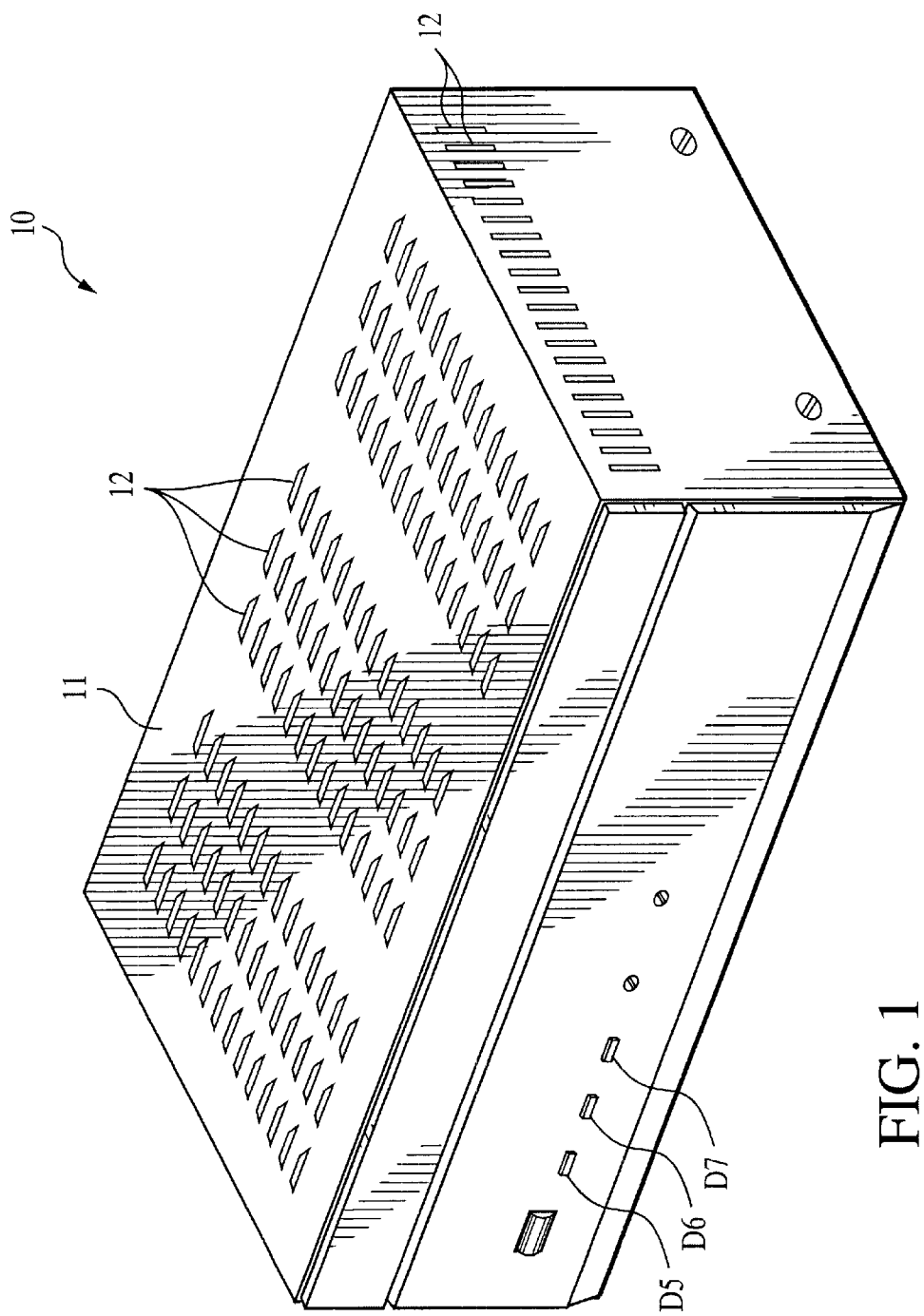
FIG. 1 is a perspective view of an audio amplifier having an audio amplifier controller with a soft start circuit according to the present invention.

FIG. 1 illustrates a perspective view of a power audio amplifier 10 having an audio amplifier power and temperature controller 20 according to the present invention (see also FIGS. 3A–3D). The audio amplifier 10 includes a housing 11 with a display 15 and a plurality of light indicators D5, D6, D7 on a front panel thereof and a plurality of vent openings 12 positioned in a top and side panels thereof. As perhaps best shown in FIGS. 2–3D, the audio amplifier power and temperature controller 20 preferably includes power receiving means for receiving power from a power source to an audio amplifier 10. The power receiving means is preferably provided by a power receiving circuit which includes a plurality of conductors P1, P2, P3, P4 positioned to receive power from a power cord, e.g., from an alternating current ("AC"), a power supply, and/or a power transformer as understood by those skilled in the art. The power receiving circuit can also include a power switch SW1 (preferably for the entire audio amplifier), or other power ON/OFF sensing circuitry, and additional ON/OFF switch circuitry, e.g., preferably resistors R4, R5 and diodes D8, D9, e.g., Schottky diodes, in a resistor-diode network with +5 volts and ground as illustrated (see FIG. 2). The power receiving circuit can also include a plurality of fuses F1, F2 connected to the conductors, a damping capacitor C9 connected to the conductors, and a main power transformer T1 connected to one of the fuses F1 and one of the conductors P3 for supplying power to the power condition switching control circuit as described further herein.

Figure 2:
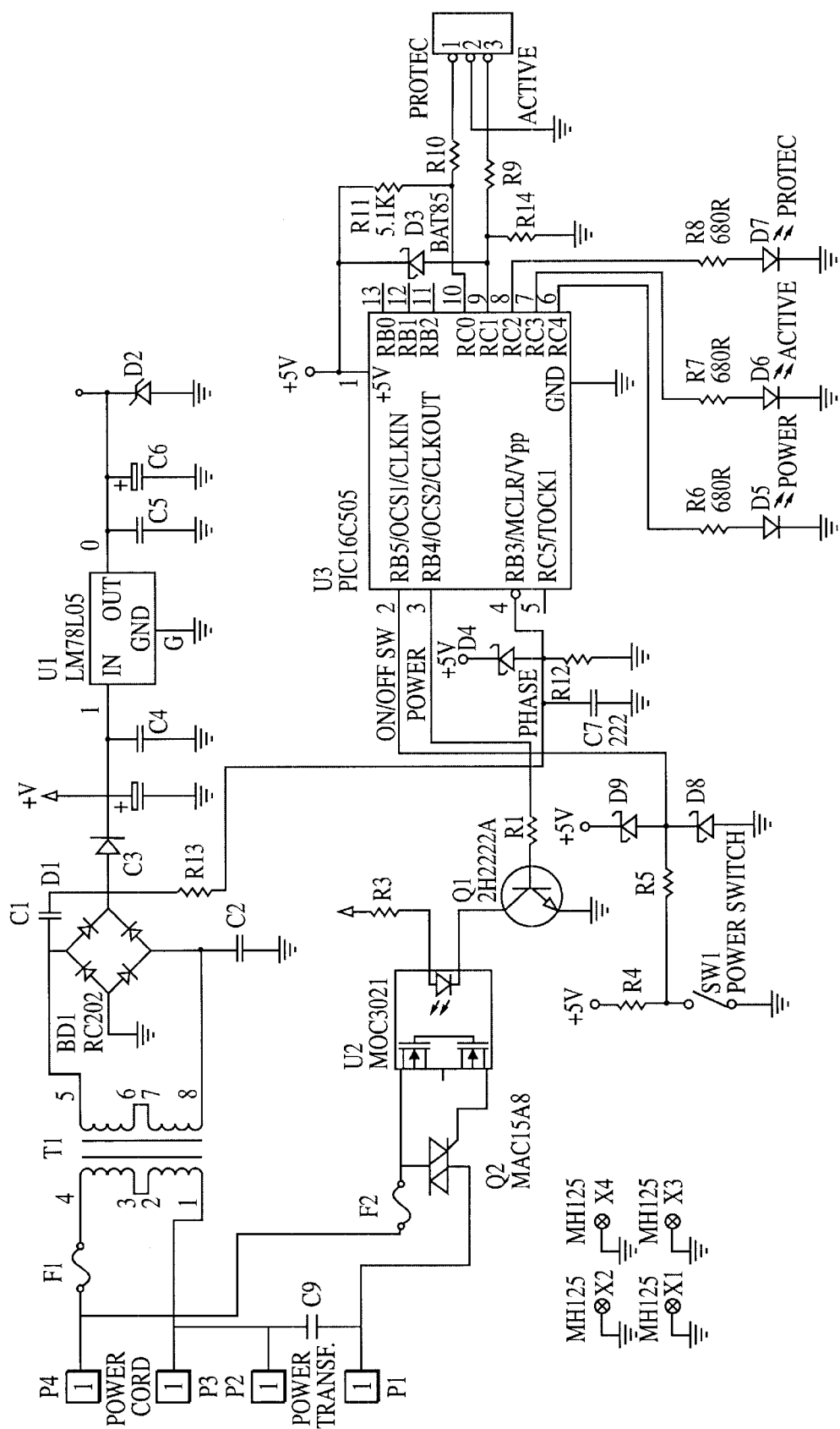
FIG. 2 is a schematic circuit diagram of an audio amplifier controller according to a first embodiment of the present invention.

The audio amplifier power and thermal controller also preferably includes power condition switching control means responsive to the power receiving means for switching components of an audio amplifier during a plurality of power conditions. The power condition switching control means is preferably provided by a power condition switching control circuit which advantageously switchingly controls power from the power receiving circuit to other components of the audio amplifier, including any amplifying transistors associated with the audio amplifier 10. The control circuit is preferably responsive to power being switched on during start up and power being supplied during continuous operation of the amplifier 10. An example of such a power condition switching control circuit is illustrated in FIG. 2. Another example is illustrated in FIGS. 3A–3D in conjunction with an audio amplifier circuit.

The power condition switching control circuit preferably includes soft starting means, e.g., preferably provided by a soft start circuit according to the present invention, responsive to the power receiving circuit for limiting inrush current from the power receiving circuit and for slowly ramping up to an audio amplifier on-state. The soft starting circuit advantageously includes a power level detection circuit to detect voltage changes by sensing frequency changes and voltage null points and a micro-controller U3, such as P1C16C505, responsive to the power level detection circuit to monitor low power conditions and high power conditions. Although particularly advantageous for amplifiers, and more particularly audio power amplifiers, the soft start circuit can also advantageously be used in other AC start up circuit applications. The micro-controller U3, for example, preferably includes wave analyzing means, e.g., a software program in the micro-controller U3, for analyzing the sinusoidal waves, i.e., AC, detected by the power level detection circuit to determine a voltage null so that the soft start function allows the audio amplifier to turn on just prior to a voltage null and to gradually ramp up to a fully on-start or high power condition. By analyzing the frequency of the waves, the wave analyzer, for example, can use the elongation of the step function to indicate a higher voltage.

As shown in FIG. 2, for example, the soft start circuit can also include a voltage regulating circuit connected to a voltage supply, e.g., +5 volts, which regulates input voltage to the soft start circuit. The voltage regulating circuit can include a voltage regulator U1 and one or more Zener or other diodes D1, D2 and capacitors C4, C5, C6 connected to power and ground. A diode D1 can also be used for isolation of the AC signal. A bridge rectifier BD1 connected to the power transformer T1, a capacitor C2 connected to ground, and a capacitor C1 is positioned to rectify the voltage from the power transformer T1. A plurality of resistors R12, R13, a capacitor C7, and a diode D4, e.g., a Schottky diode, are also connected to the capacitor C1 in a network arrangement as illustrated and the +5 volts source, ground, and a pin (Pin 4) of the micro-controller.

The power level detection circuit is preferably provided by a power triac or other similar circuit which tracks or detects when alternating current ("AC") power is low at the end of a cycle to limit inverse current. An optocoupler or optoisolator U2 provides optical isolation between the power receiving circuit and the transistor Q1, as well as resistors R1, R3 to indicate power status to the micro-controller U3 at a pin (Pin 3) thereof.

Figure 6:
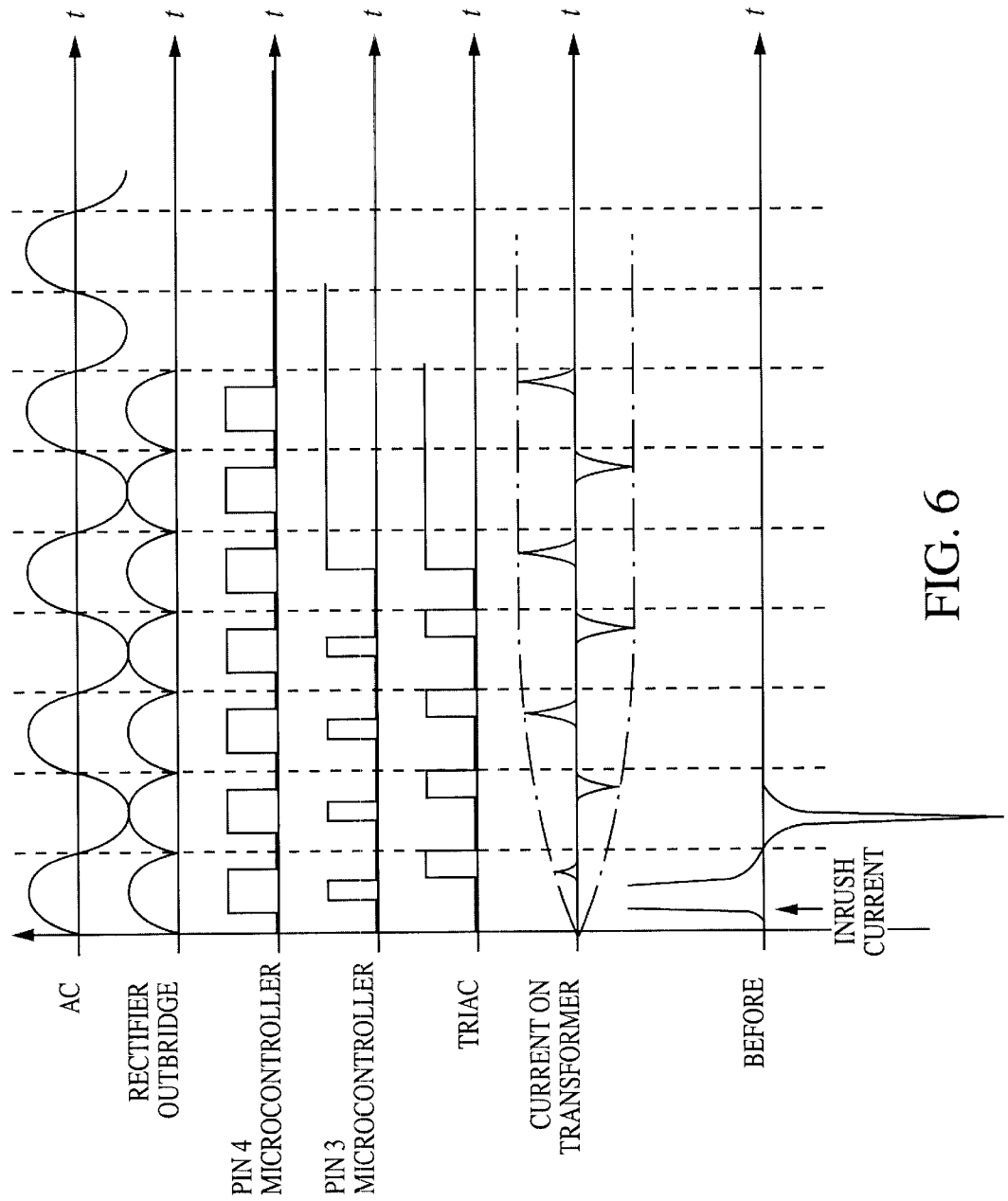
FIG. 6 is a graph of timing diagrams for methods of controlling an audio amplifier according to the present invention.

The micro-controller U3 of the soft starting circuit receives an analog signal as an input to Pin 4. This signal is processed in the micro-controller U3 without utilization of an external or internal analog to digital converter ("ADC") as understood by those skilled in the art. Instead, this is accomplished by taking advantage of the characteristics of a micro-controller, e.g., formed of silicon CMOS. As perhaps best shown in FIGS. 2 and 6, the AC signal from the diode bridge rectifier BD1 is delivered to Pin 4 in analog form. The software programs embedded or stored in the micro-controller can be written to allow the micro-controller to assign a digital value to each timed portion of the input analog signal (timing is referenced to the micro-controller internal clock as understood by those skilled in the art). The software of the micro-controller can also be written to accomplish frequency, amplitude, and input AC voltage "null to null" timing based on a digital replica made of the analog signal input at Pin 4. The software program is preferably written in such a manner to be independent of micro-controller device technology. In other words, gallium arsenide (GaAs), silicon germanium (SiGe), or silicon carbide (SiC) based micro-controllers, for example, will also function accurately in this circuit without the use of external or internal ADC using such software capabilities.

The power switching control circuit also preferably includes thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions. The thermal status monitor and controlling means is preferably provided by a thermal status monitoring and controlling circuit which can be provided by the micro-controller U3 and software programs stored or embedded therein, and as described further herein with reference to FIGS. 4A–5G.

Output monitoring means of the power switching control circuit is also provided for monitoring current output circuits of the audio amplifier 10 to protect the amplifier during a high current condition, e.g., transients or electro-static discharge, when connected to the audio amplifier by disconnecting a load to the current output circuits and reconnecting the load to the current output circuits when normal operating current conditions resume. The output monitoring means includes means for monitoring the output current circuits to determine if full audio amplifier shut down is desirable to protect the audio amplifier 10 and speakers or other audio system components when connected thereto. The output monitoring circuit, for example, can include a connector J2 for connecting the power condition switching control circuit to an input circuit of the power amplifier, and a resistor and diode network, e.g., including R9, R10, R11, R14, and D3, connected to the connector J2 and the micro-controller U3, as well as ground and power, e.g., +5 volts. The micro-controller and software programs embedded or stored therein also can form a portion of the output current monitoring circuit as described with reference to FIGS. 4A–5G herein.

The power condition switching control means further includes input power discriminating means responsive to the power receiving means for discriminating between incoming audio component signals to turn-on the audio amplifier 10 to the on-state and transient line voltage to momentarily sense the signal but not activating the audio amplifier 10 to the on-state. The input power discriminating means is preferably provided by a power discriminating circuit. The power condition switching control means also further includes brown-out protecting means for protectively preventing the audio amplifier 10 from going into and remaining in a circuit protection or sleep mode by continuously monitoring the audio amplifier 10 for normal current conditions and responsively resuming normal amplifier operations when normal current conditions occur. The brown-out protecting means is also provided by a brown-out protecting circuit. Both the discriminating circuit and brown-out detection circuit are preferably provided by the micro-controller U3 and software programs stored therein, and as further described with respect to FIGS. 4A–5G.

The audio amplifier power and thermal controller 20 can also advantageously include visual feedback means responsive to the power condition switching control means for providing visual operating and error status feedback for diagnosing operating and error status conditions. The visual feedback means includes indicating means, e.g., preferably provided by a software program in a micro-controller U3 and/or as a separate hardware circuitry, e.g., resistors R6, R7, R8, for indicating at least one predetermined visual signal and a plurality of light sources, e.g., light emitting diodes ("LEDs") D5, D6, D7, responsive to the indicating means to visually display light representing the at least one predetermined visual signal.

FIGS. 3A–3D illustrate an audio amplifier having another embodiment of a power and thermal controller 20' of the present invention. These figures illustrate the amplification on the left and right channels in FIGS. 3A–3B (see also connection of FIG. 3D). These amplification circuits are substantially the same for each channel and are connected by a connector bridge JP1O and a resistor R134. Each amplification circuit includes a switching or logic circuits JP9, a plurality of transistors Q101–Q116, Q201–Q216, a resistor, capacitor, and diode network having a plurality of capacitors C101–C116, C201–C216, a plurality of resistors R101–R133, R201–R233, and a plurality of diodes D101–D106, D201–D206. These circuits serve primarily the amplification function of the audio amplifier. The amplification circuits can also include the circuits shown in FIG. 3B which are also substantially similar and include logic or switching interface circuits JP301, JP302, JP306, JP307, resistors R301–R304, capacitors C304–C307, fuses F302–F305, and bridging circuits U301, U302.

Figure 3A:
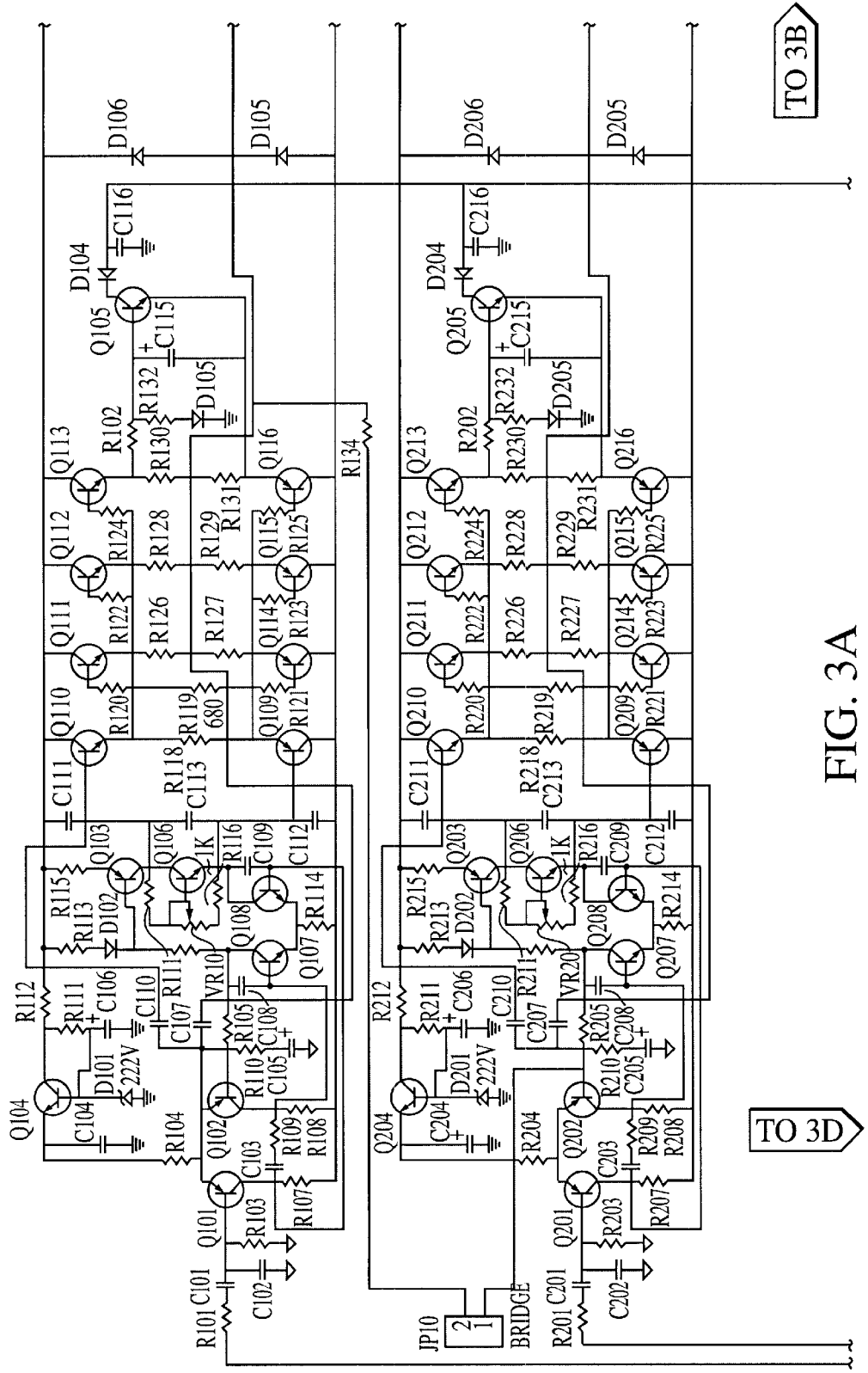
FIGS. 3A–3D are schematic circuit diagrams of an audio amplifier controller according to a second embodiment of the present invention.
Figure 3B:
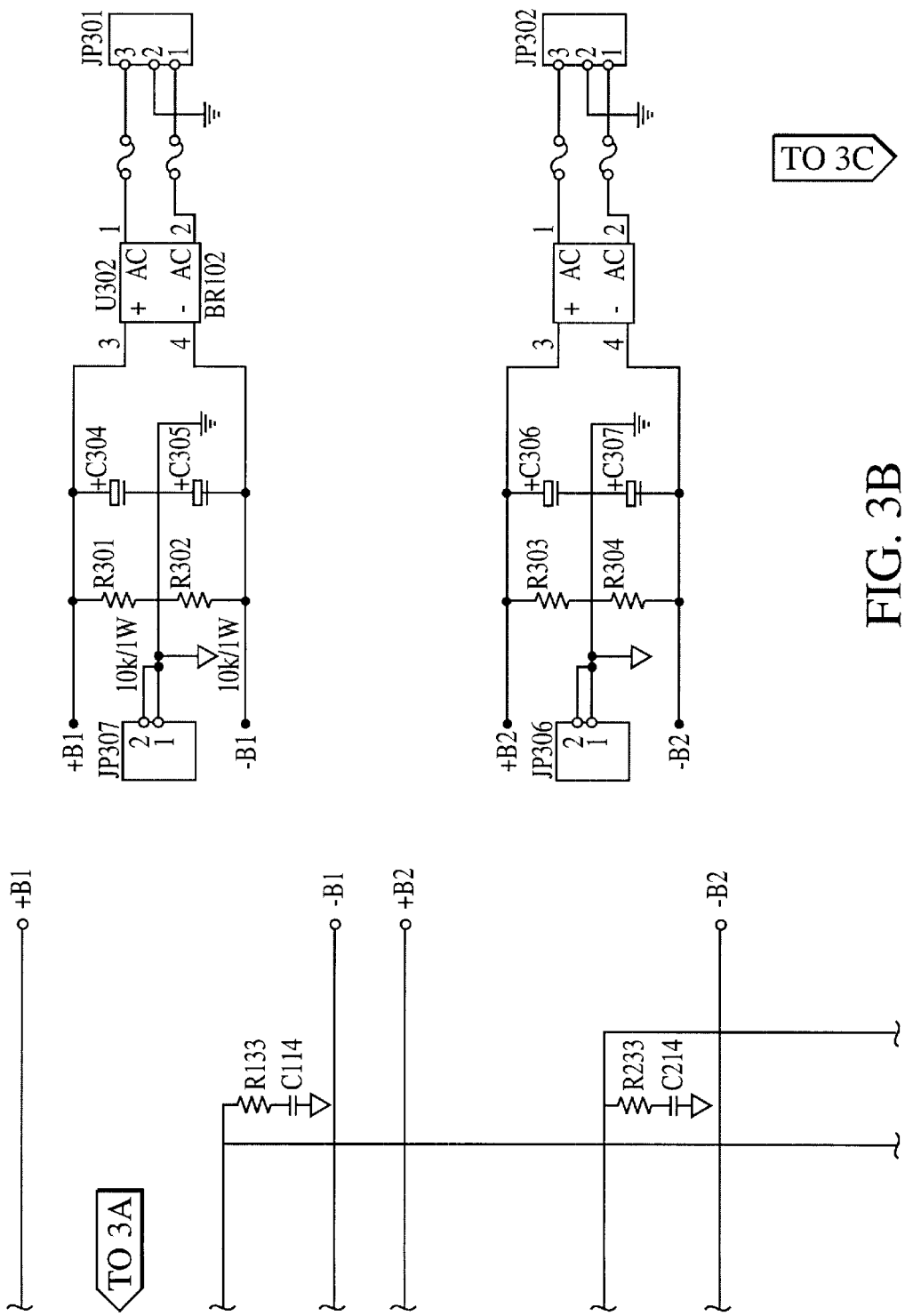
Figure 3C:
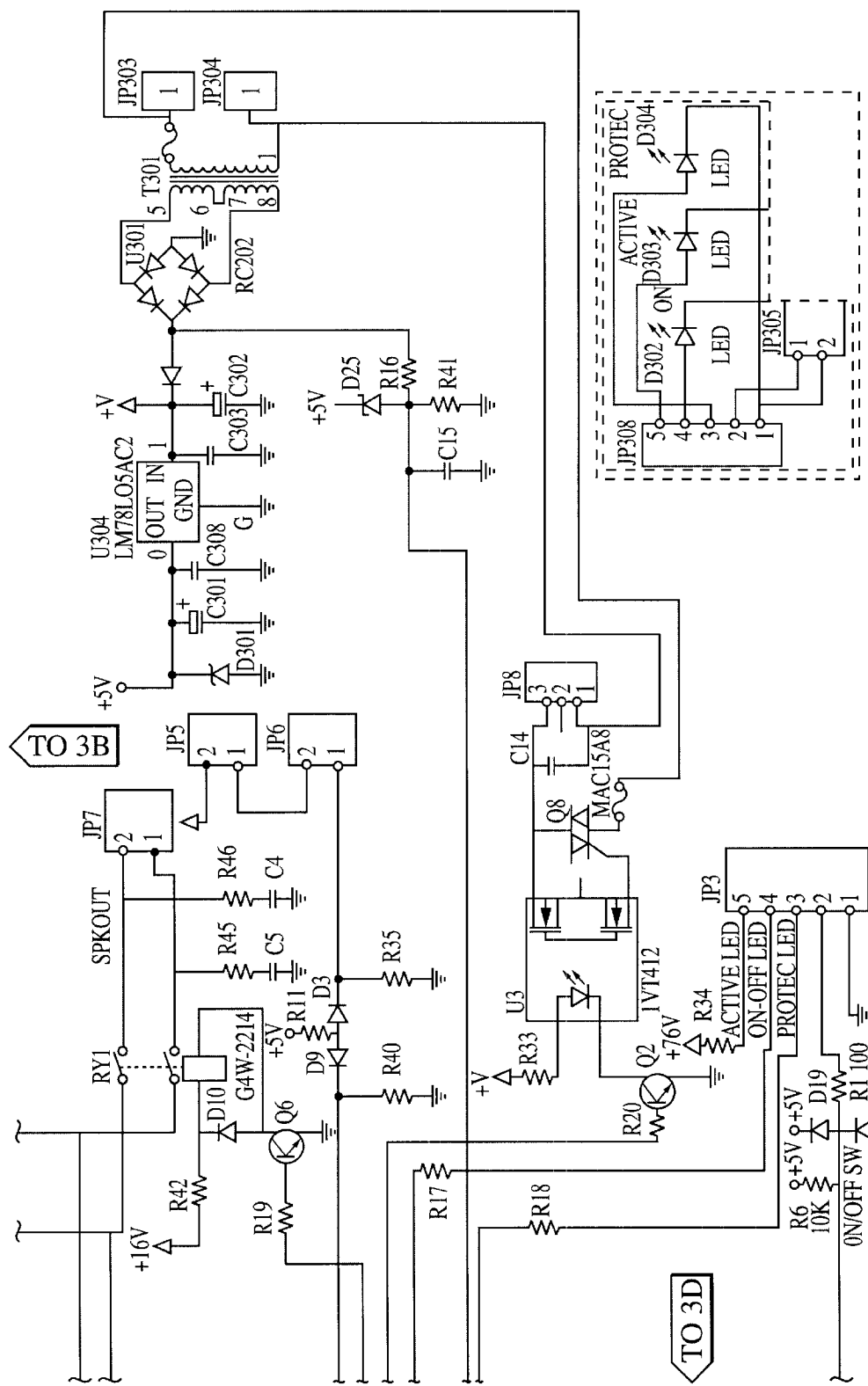
Figure 3D:
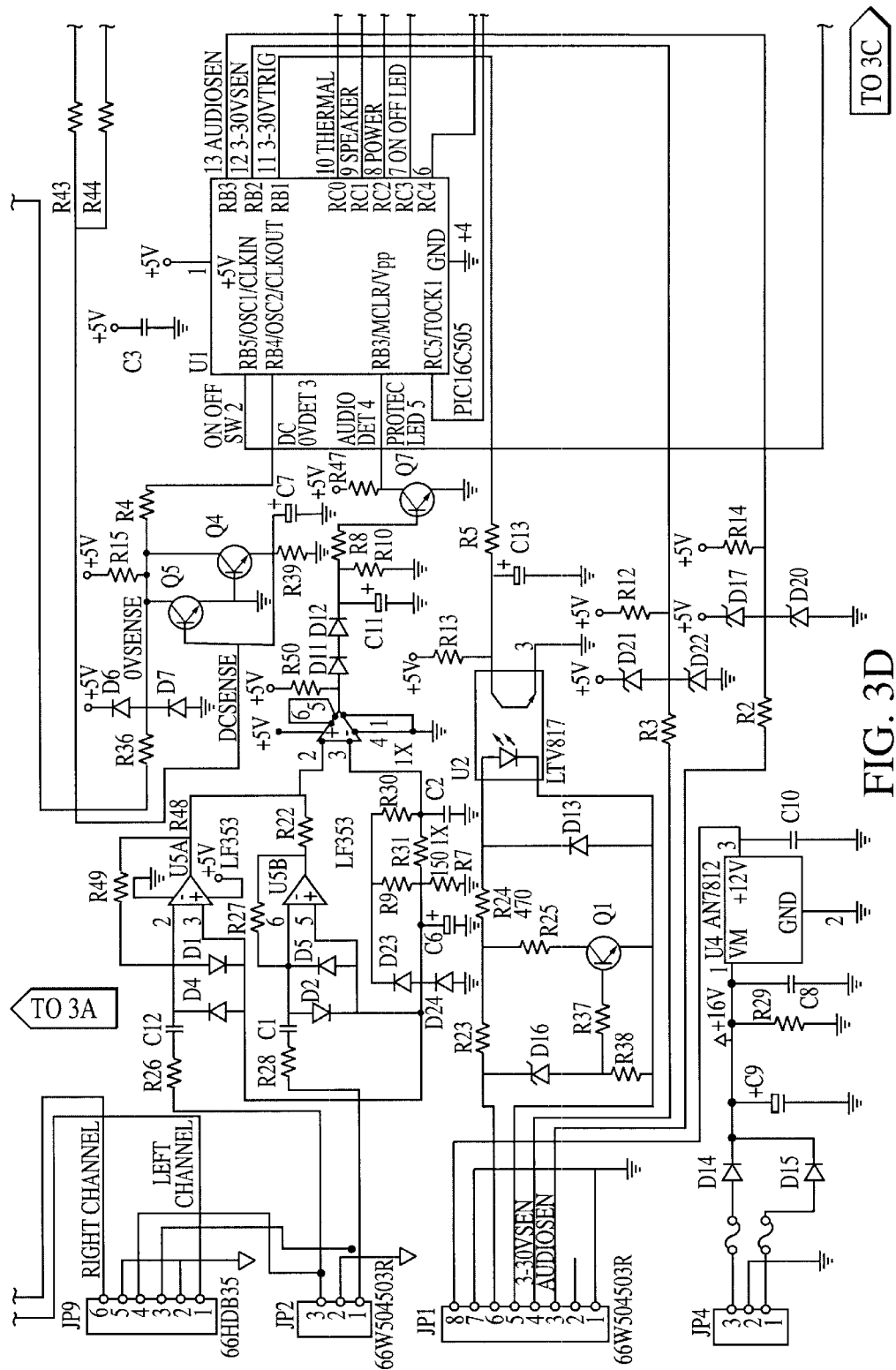

FIGS. 3C and 3D illustrate another embodiment of the power condition switching control circuit 20'. This circuit 20' likewise includes a main power transformer T307, a bridge rectifier U307, a triac Q8, an optocoupler or optoisolator U3, a micro-controller U1, and fuses F3, F307 similar to the first embodiment described above. Logic or switching interface circuits JP8, JP303, JP304 are also connected to the transformer T307 and to the triac Q8 and fuse F3. The visual operating and error status feedback circuits are provided by LEDs D302, D303, D304 and resistor or logic circuits JP305, JP308 connected thereto. The output from the bridge rectifier U307 likewise has diode D25, resistors R16, R41, and capacitor C15 network connected to the bridge rectifier U307 and Pin 6 of the micro-controller U1.

The thermal monitoring circuit is provided by portions of the micro-controller U1 and the diode D3, D9, and resistor R11, R35, R40 circuit and logic or switching interface circuits JP5, JP6. The power receiving circuit can also include the ON/OFF switch SW, the diodes D18, D19 and resistors R6, R100 connected thereto, to Pin 2 of the micro-controller U1, and to the logic circuit JP3. The logic or switching interface circuit JP3 also has resistors R17, R18 connected thereto and to Pins 6 and 7 of the micro-controller U1. The soft starting portion of the circuit also has resistors R20, R33, transistor Q2, capacitor C14, and logic circuit JP8 connected thereto as illustrated. Likewise, the circuit also has a voltage regulating circuit which includes a voltage regulator U304 and a diode D307 and a plurality of capacitors C307, C308, C303, C302 connected thereto. A diode IN4007 also is positioned to isolate an AC signal and is connected to the bridge rectifier U307 as illustrated.

As perhaps best illustrated in FIGS. 3C–3D, the power condition switching control circuit can also include an audio sense circuit or connector for sensing audio at Pin 13 of the micro-controller U1, resistor R2, and the logic circuit JP1. A 3–30 volt range function circuit is also provided at Pin 12 of the micro-controller U1, resistor R3, and logic circuit JP1. An audio detect circuit is provided connected to Pin 4 of the micro-controller U1 and have a switching or logic circuit JP2 connected thereto. The audio detect circuit includes a transistor Q7, a plurality of resistors R8, R9, R22, R26, R27, R28, R30, R47, R48, R49, R50, a plurality of capacitors C1, C2, C6, C11, C12, and a plurality of diodes D1, D2, D4, D5, D11, D12, D23, D24 connected in a network. The audio detect circuit also includes a plurality of amplifiers U5A, U5B, U5C in a stage arrangement as illustrated.

Also, a direct current or over current detect circuit is provided connected to Pin 3 of the micro-controller U1 and has transistors Q3, Q4 connected thereto. This detect circuit also has a plurality of resistors R4, R15, R36, R39, R43, R44, a plurality of diodes D6, D7, and a capacitor C7 connected thereto. Capacitor C3 also illustrates a capacitor positioned to a ground connection. The circuit also connects to a relay, or switch, RY1 to the speaker output at logic or switching circuit JP7 and resistors R45, R46 and capacitors C4, C5. The speaker circuit is also connected to Pin 9 of the micro-controller U1 and has a transistor Q6, a plurality of resistors R19, R42 and a diode D10 connected thereto.

Further, the audio sense and 3–30 volt range function detect circuits can have a circuit connected to the logic or switching interface circuit JP1. This circuit includes a logic or switching interface circuit JP4, a pair of fuses FP, F2, a pair of diodes D14, D15, a plurality of capacitors C8, C9, C10, a resistor R29, and a voltage regulator U4.

Figure 4A:
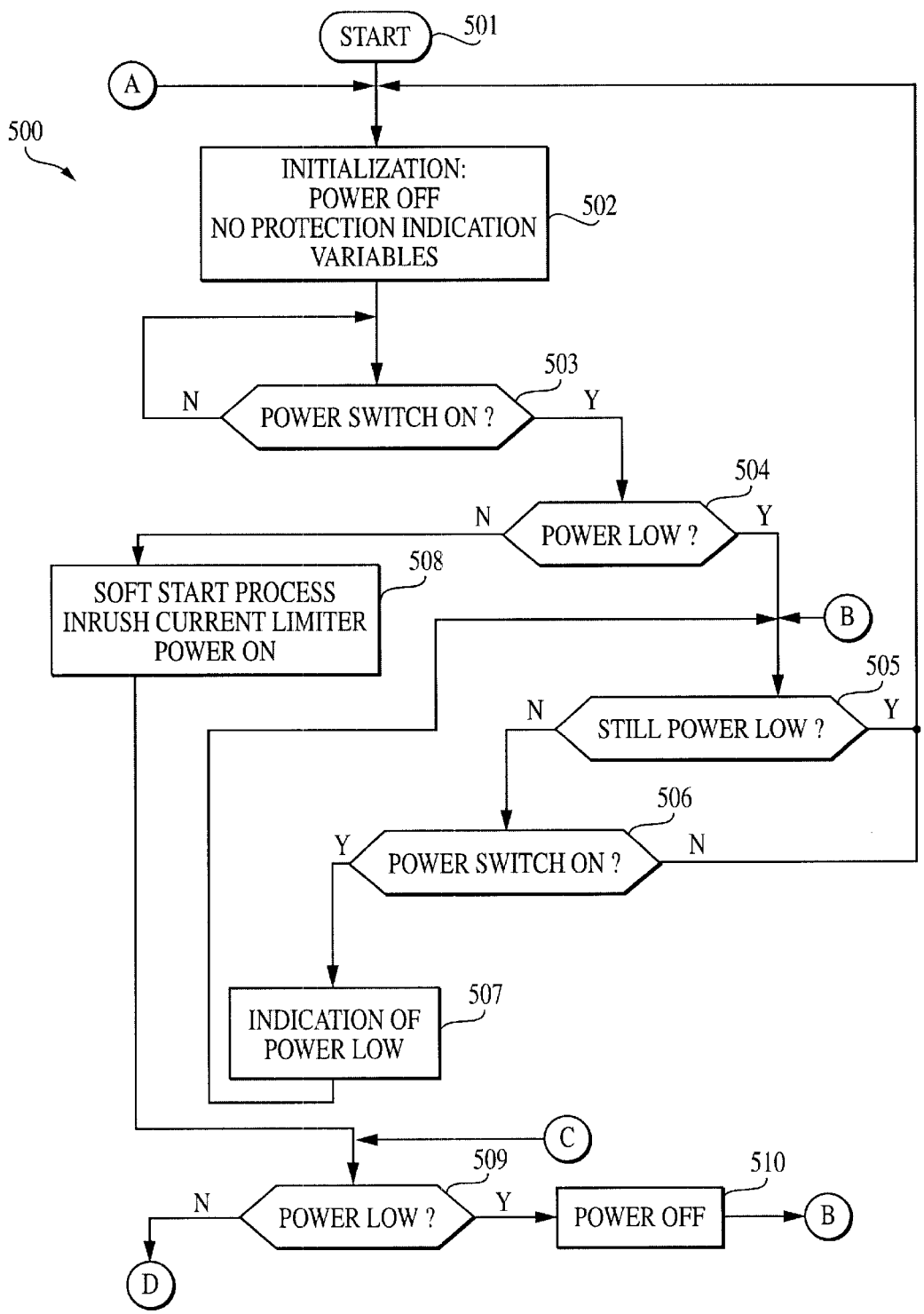
FIGS. 4A–4B are schematic flow diagrams of a method of controlling an audio amplifier according to a first embodiment of the present invention.
Figure 4B:
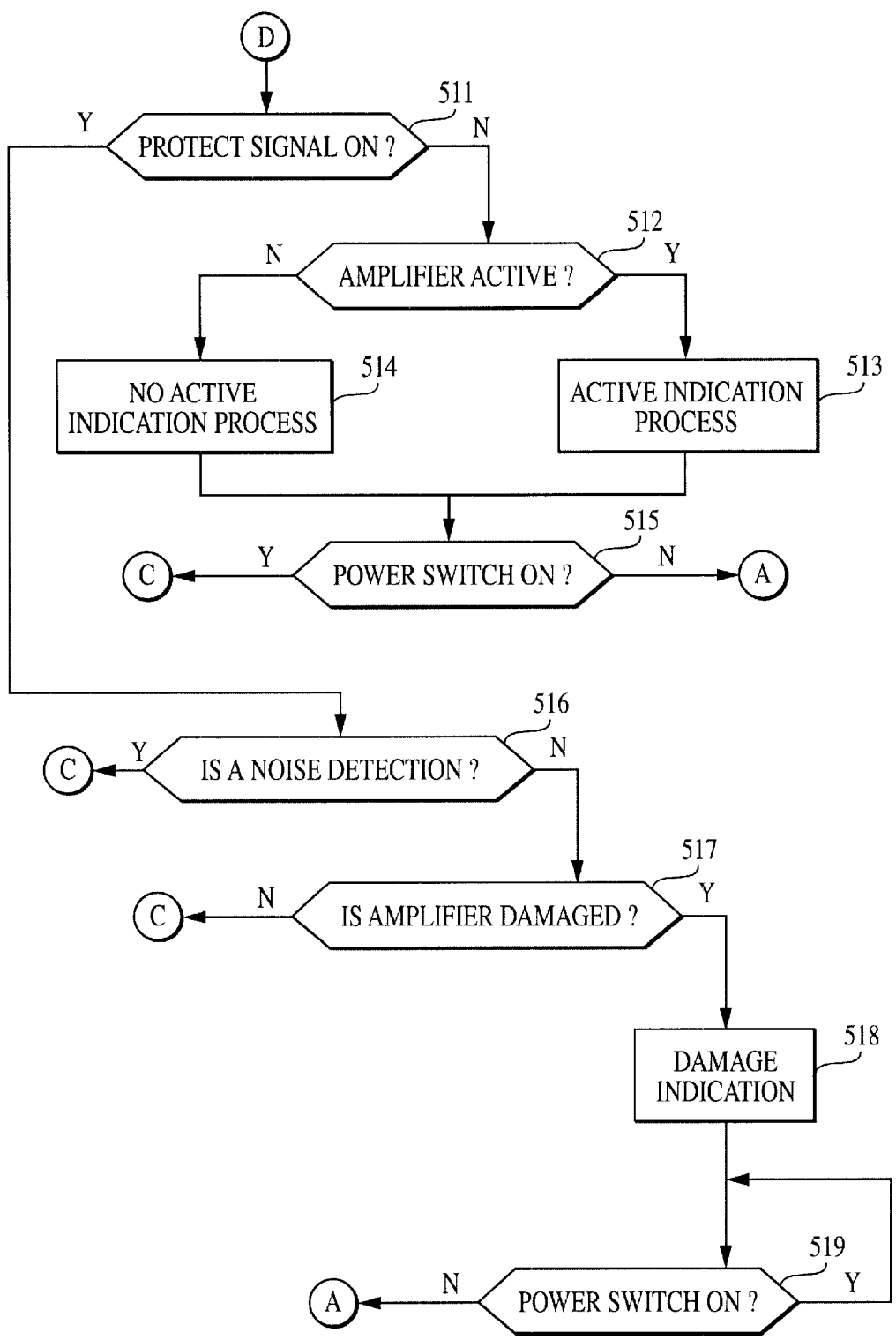

FIGS. 4A and 4B are schematic flow diagrams of portions of the power condition switching control circuit illustrating the soft start method or process of the present invention. The method 500 includes starting the process 501 by initialization 502 where the power is off and no protection indication variables are required internal to the micro-controller U3. The next step is to check whether the power switch is turned on 503 (see Pin 2 of micro-controller U3). If not, then a loop back to this step 503 continues. If the power switch is turned on, however, a determination is made as to whether the power is low 504 (see Pin 4 of micro-controller U3) such as in a brown-out condition. The threshold level, for example, can be 2 volts. If the power is low, then a determination is made as to whether this was a false signal or a power problem exists 505. If so, then initialization can reoccur 502 or a determination made as to whether the power switch is really on or still on 506. If the power switch is still on after a selected lapsed time, a power low indication 507 can be made to a user or technician so that the user or technician can check the power status of power being supplied to the audio amplifier controller and audio amplifier and the amplifier will not be turned on.

If, on the other hand, the power is not low, e.g., below a predetermined threshold, then the soft start process is started to limit the inrush current 508. The controller monitors the soft start process to make sure that a low power condition has not arisen 509. If so, then a determination is made as to whether the power is off 510. If there is a preliminary indication, then a time period elapses to verify this determination (see B). The process returns to verify that the power is still low 505 and that cycle continues as described above.

If the power is not low (see D and FIG. 4B), however, then a circuit protect process 511 is initiated to protect the output of the output circuits (see Pin 10 of micro-controller U3) during high current conditions. The protect signal is initiated and an LED, e.g., D7 or D304, is turned on. If the protect signal is not initiated for some reason, then a determination is made as to whether the amplifier is active 512, e.g., to monitor whether the amplifier is in a sleep mode or not. If the amplifier is active, then an active indication process 513 is initiated, and a determination as to whether the power switch is still on 515 is made. If the amplifier is not active, then a no active indication process is initiated, and a determination as to whether the power switch is on 515 is also made.

If the protect signal is on, then a determination is made as to whether the signal was noise 516 such as a longer transient spike or a real power on signal. If it was noise (see C), then a determination is made as to whether power is low 509 to verify this determination, and the process 509 continues. If it was not noise, then a determination is made as to whether the amplifier is damaged 517 is made. If not (see C), then a determination of whether power is low now 509 is made. If the amplifier has been damaged, then a damage signal or indication 518 is made, e.g., requesting that a user or technician turn off the amplifier. The process would then check to see if the power switch is still on 519. If so, the damage indication would continue. If not, then the process returns to the initialization 502 (see A and FIG. 4A).

FIGS. 5A through 5G illustrate an additional embodiment and further aspects of a power condition switching control circuit. These schematic flow diagrams of portions of the power condition switching control circuit illustrate the methods and processes of the structure as described above herein. The method or process 600 of the present invention preferably starts 601 by initialization 601 where the amplifier power indication is off and the amplifier is mute. A determination is then made as whether the power switch is on 603 or detected as being in an on position. If the switch is not on, then a continuous wait to see if the switch is turned on occurs. If the switch is on, then a determination of whether the power is below a predetermined threshold or at an AC brown-out level is made 604. If so, then a determination is made as to whether the amplifier is off or mute 605 and whether an AC brown-out is still occurring 606. If the amplifier is off or not brown-out condition is detected, then initialization 602 reoccurs. If the power switch is still on 607, then an indication of an AC brown-out level 608 occurs.

If the power is not low or no brown-out condition is detected, then power on indication 609 occurs. If the power switch is not on or turned off 610, then initialization reoccurs 602. If the power switch is still on 610, then a determination is made as to whether an audio sense function is on 611. If the function is not on, then a determination is made as to whether a 3–30 volt range function is on 612. If the 3–30 volt range function is on, then a determination is made as to whether the amplifier is active 613 (see FIG. 5B).

If the amplifier is active, then an AC brown out level determination 621 is made, and the process as described above at 605 is repeated (see B of FIG. 5A). If the amplifier is not active, then the soft start process is initiated by limiting the inrush current 614 to slowly turn the amplifier on 615 or to an active state with the amplifier mute function in an off-position. A determination is then made as to whether the direct current or over current signal 616 is on. If not, then a determination is made as to whether a thermal signal is on 617. If not, then a determination is made as to whether the power switch is still on 618. If not, then initialization 602 reoccurs. If so, then whether the audio sense function is on is determined 619. If not, the 3–30 volt range function is reevaluated 620. If this function is not on, then a brown-out level determination is made again 621 (see also B of FIG. 5A at 605).

If, on the other hand, the audio sense function is on 611 and 619, then a determination is made as to whether the amplifier is active 622. If the amplifier is not active, then the amplifier is off and/or amplifier mute may be on. A determination is made as to whether the audio signal is on 625. If not, then a determination is made as to whether the power switch is on 610 again (see C of FIG. 5A). If the audio signal is on, however, then the soft start process is initiated 626 to limit the inrush current and slowly ramp up to an amplifier on-state with the amplifier mute in an off position and the amplifier active 627. If the amplifier is active, then a determination is made as to whether the audio signal is on 623, 628. If the audio signal is on, then a determination is made as to whether the power switch is still on 629. If not, then initialization 601 reoccurs. If so, however, then a determination is made as to whether a direct current or over current signal is on 630. If not, then a determination is made about the thermal signal 631. If the thermal signal is not on, e.g., no overheat condition, then a determination is made as to whether the 3–30 volt range function of the amplifier is on 632. If not, then a determination is made as to whether the audio sense function is on 633. If not, the process of step 622 is repeated (see FIG. 5C). If so, then a brown-out level is determined 634. If a brown-out condition is detected, then the process returns to step 605 (see B of FIG. 5A). If no brown-out condition is detected, then the process returns to the audio signal on determination 628 and the process repeated.

If, however, the 3–30 volt range function is on 612, 620, 632 (see FIG. 5D), then a determination is made as to whether the amplifier is active 635. If so, then the 3–30 volt range function signal is determined to be on or not 636, 641. If the amplifier is not active, then the amplifier is off and/or the amplifier mute is on 637. Then a determination is made as to whether the 3–30 volt signal is on 638. If not, then a determination is made again on whether the power switch is on 610 (see FIG. 5A). If the signal is on, however, then the soft start process to limit the inrush current and slowly ramp the current up to an amplifier on-state 639 is initiated. The amplifier mute is then off and the amplifier is active 640.

A determination is then made as to whether the 3–30 volt range function signal is on 641. If not, then the process of step 635 is repeated. If this function signal is on, then a determination is made again whether the power switch is still on 642. If not, then initiation 601 is repeated. If the power switch is still on, then a direct current or over current signal determination 643 is made. If this signal is not on, then a thermal signal on condition is determined 644. If this signal is not on, then an audio sense function signal is determined 645. If this is on, then the process of step 622 (see E of FIG. 5C) is repeated. If this audio sense function signal is not on, then the 3–30 volt range function signal is determined 646. If this is on, then a brown-out condition determination is repeated 647 (see B of FIG. 5A). If this brown-out level is not occurring, then the process of step 641 is repeated.

Figure 5A:
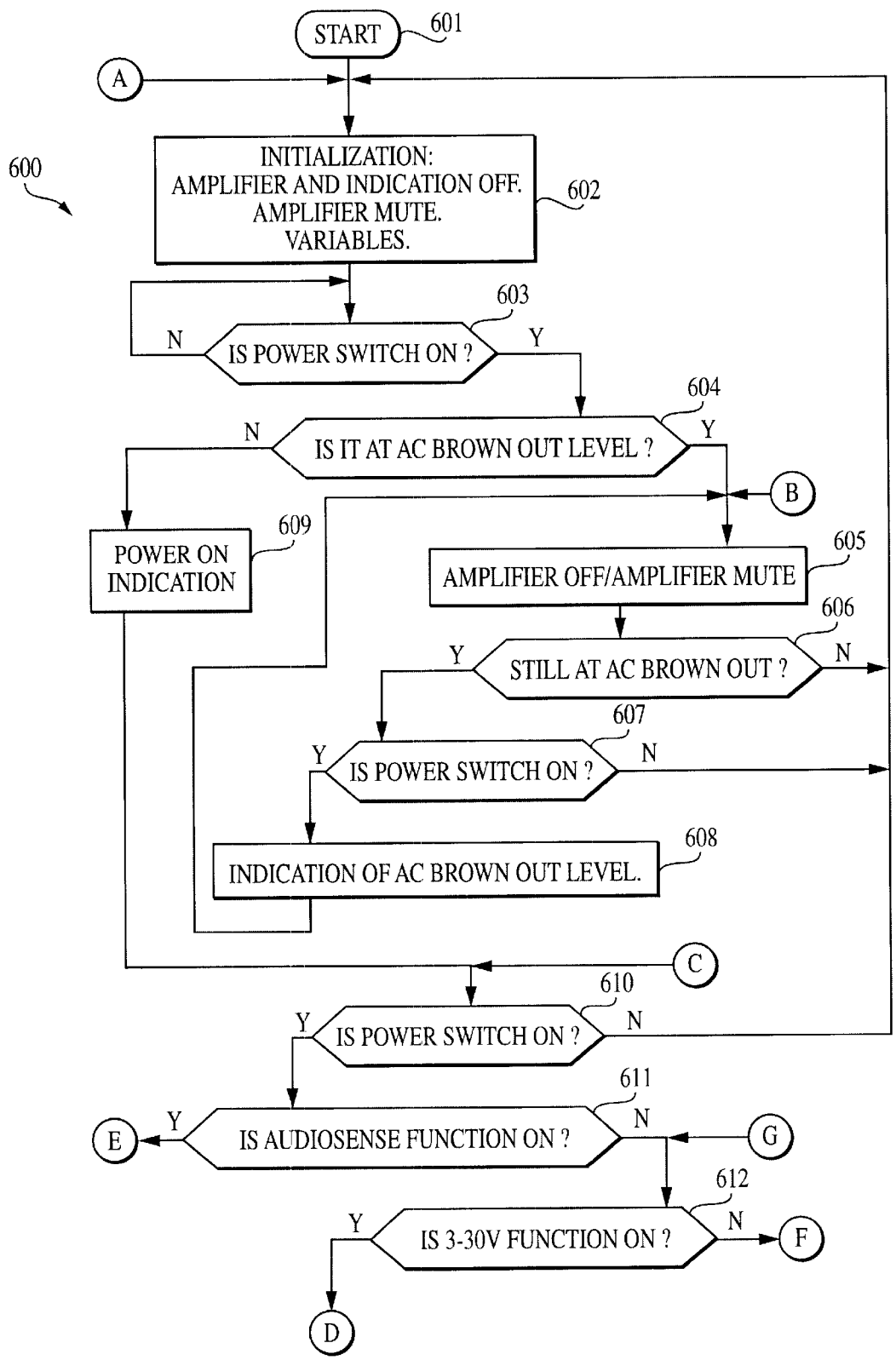
FIGS. 5A–5G are schematic flow diagrams of a method of controlling an audio amplifier according to a second embodiment of the present invention.
Figure 5B:
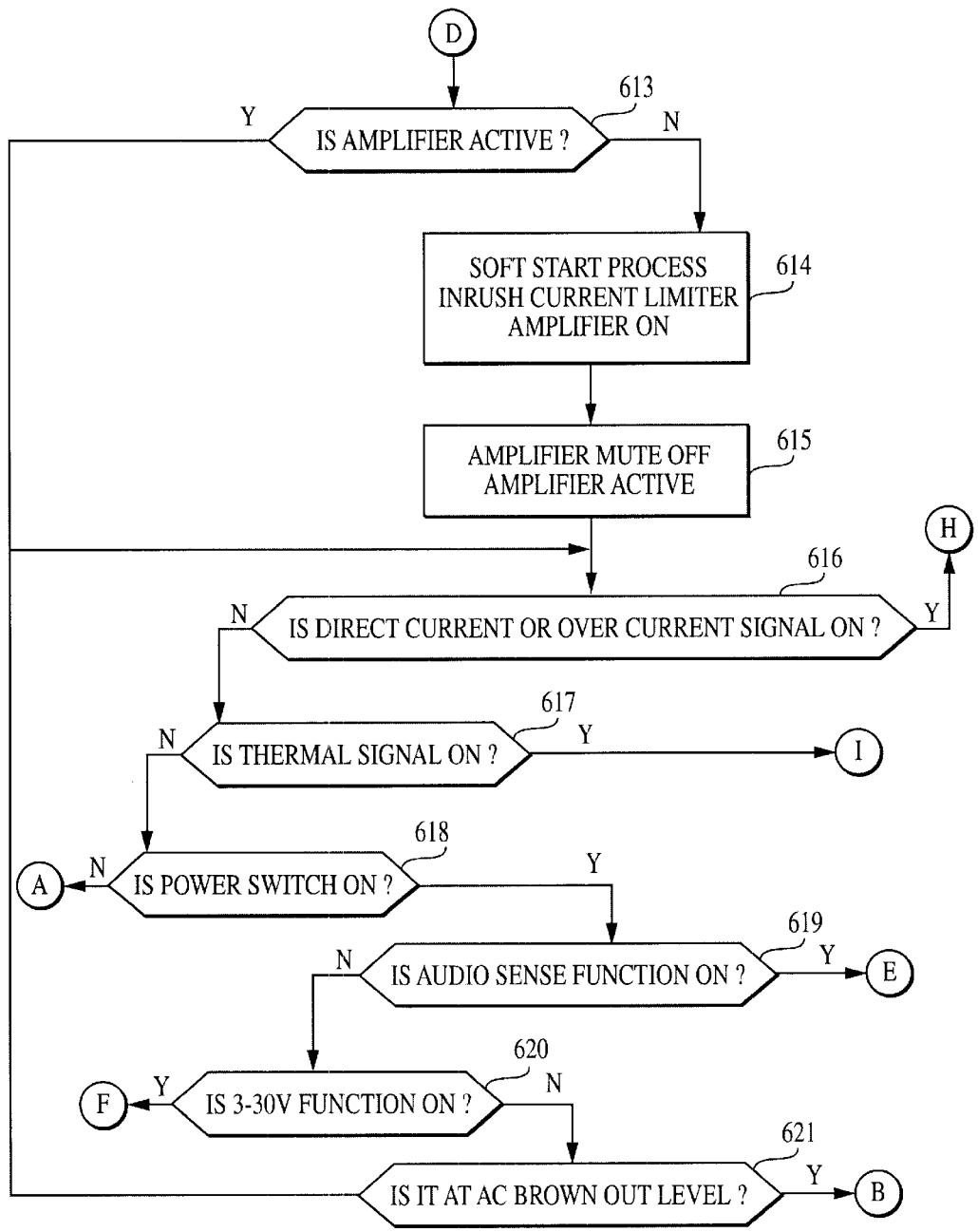
Figure 5C:
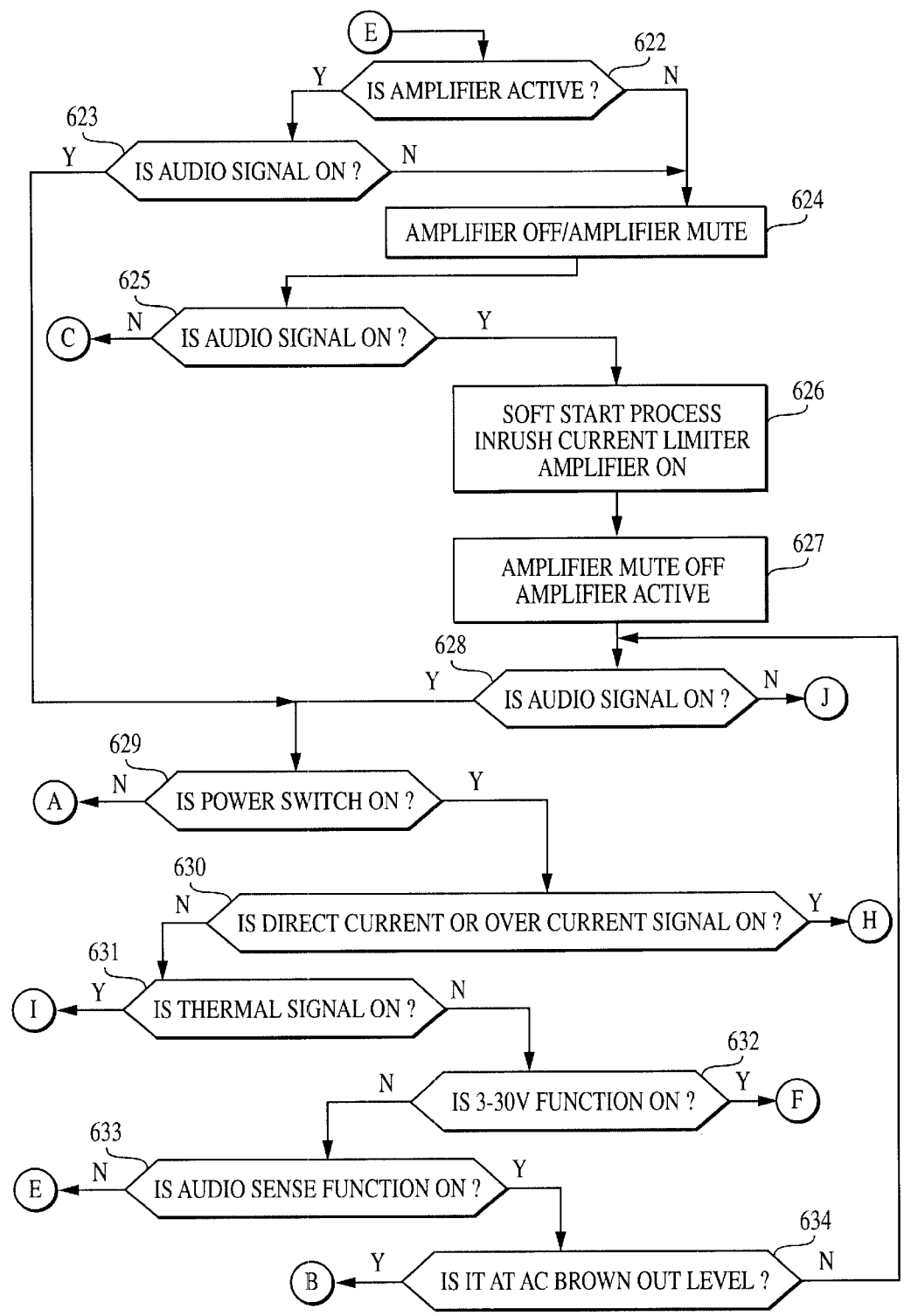
Figure 5D:
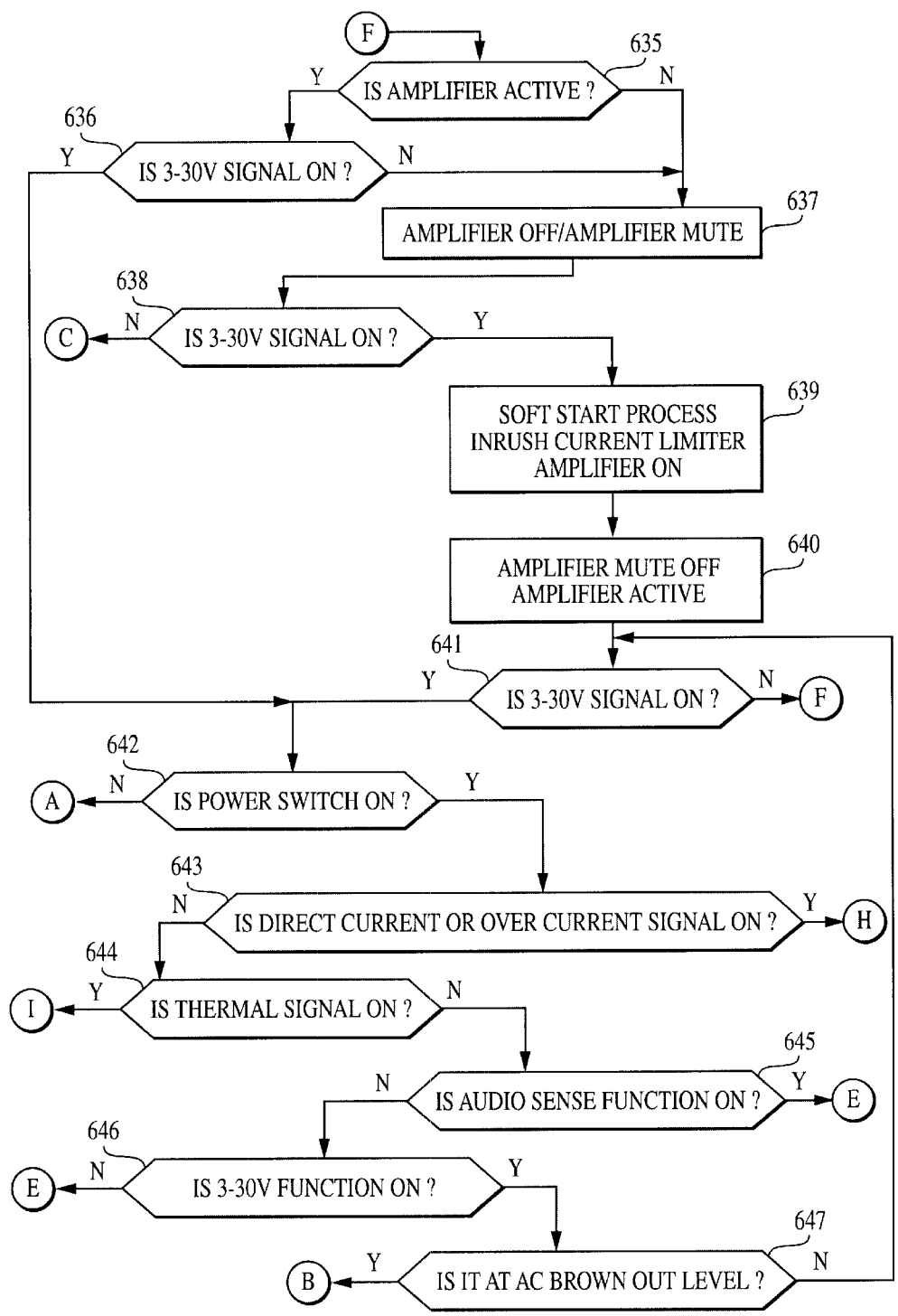
Figure 5E:
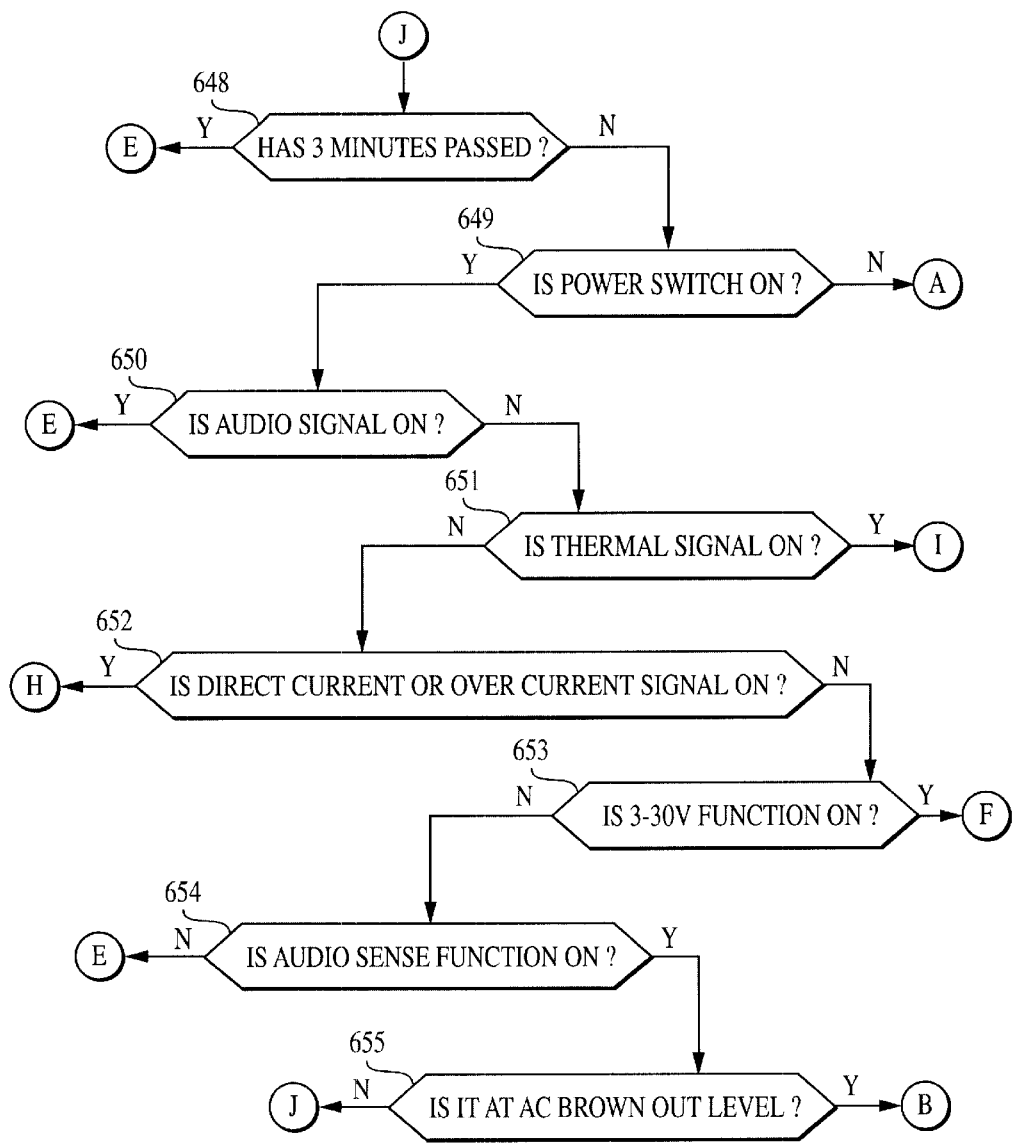

Now, as set forth in FIG. 5C, if the audio signal is not on 628, then a determination is made as to whether a predetermined time lapse or period, e.g., 3 minutes, occurs 648 (see FIG. 5E). If it has occurred, then the process of step 622 (see E of FIG. 5C) occurs. If this time period has not lapsed, then determinations are made as to whether the power switch is on 649, whether the audio signal is on 650, whether the thermal signal is on 651, whether the direct current or over current signal is on 652, whether the 3–30 volt range function is on, whether the audio sense function is on 654, and whether a brown-out level occurs 655.

Figure 5F:
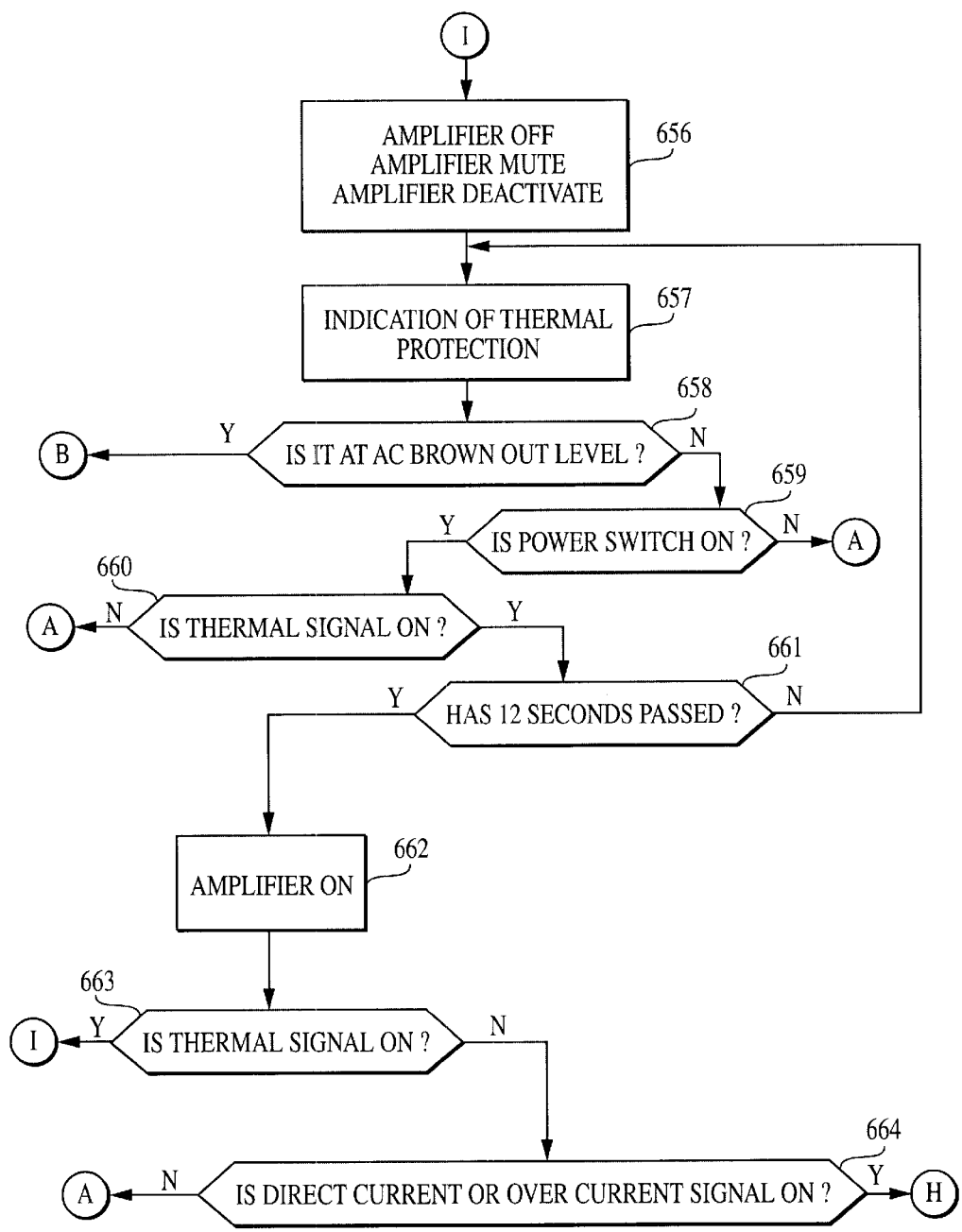

If the thermal signal is on 617, 631, 644, 651, then the amplifier is turned off, muted, and deactivated 656 (see FIG. 5F). Thermal protection is also indicated 657. The controller then determines whether a brown out level exists 658. If not, then determinations are made as to whether the power switch is on 659, the thermal signal is on 660, or has a predetermined time period, e.g., 12 seconds, passed 661. If the time period has not passed, then the thermal protection indication continues 657 and the steps are repeated. If the period has passed, then the amplifier is turned on 662, and a determination of whether the thermal signal is still on 663 is made. If so, then the process of step 656 is repeated. If not, the direct current or over current signal on condition is determined 664.

Figure 5G:
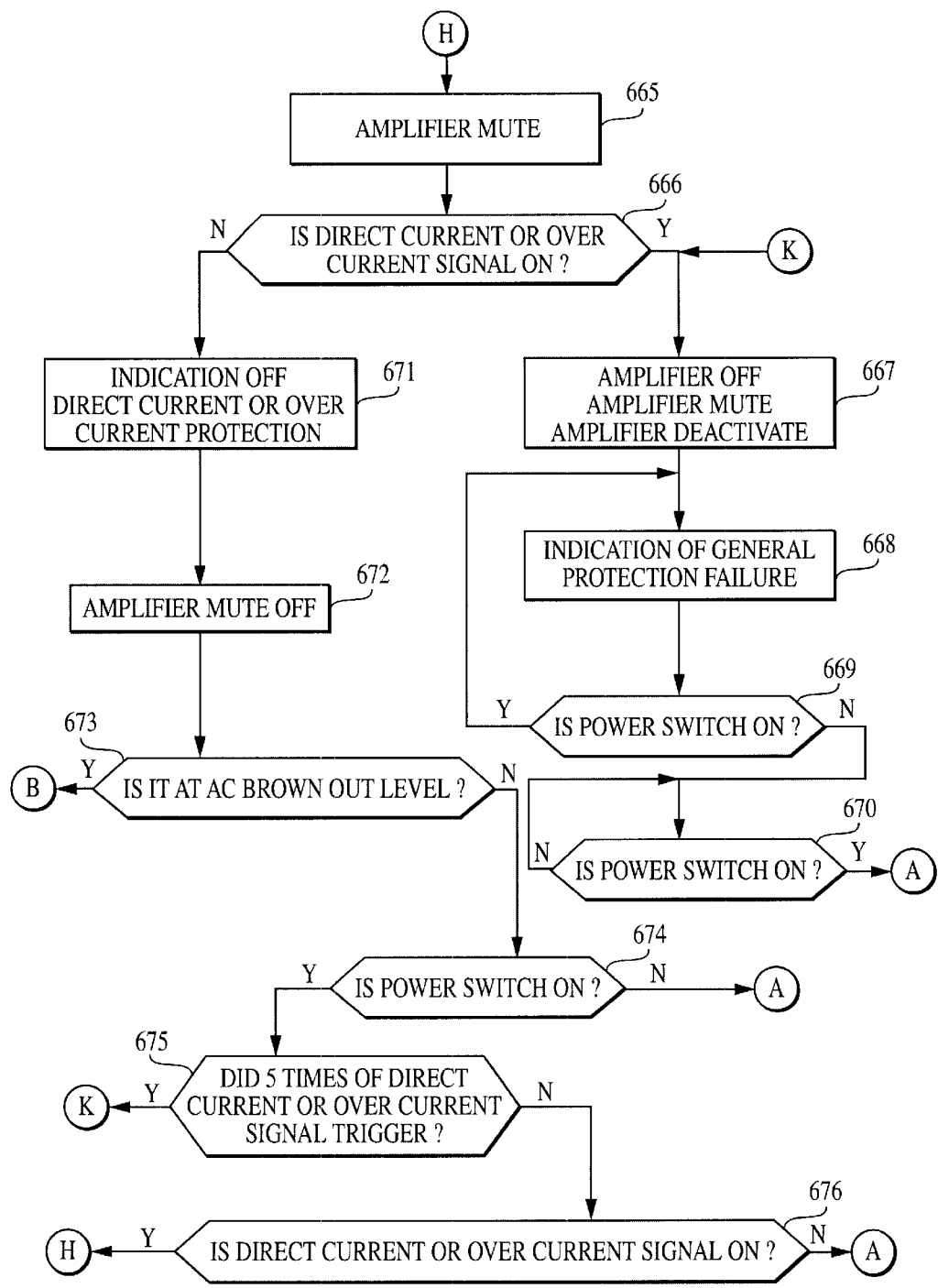

If the direct current or over current signal is on 616, 630, 643, 652, 664, then the amplifier is muted 665 (see FIG. 5G). The same direct or over current signal condition is reevaluated 666. If the signal is on, then the amplifier is off, muted, and deactivated 667 and an indication of general protection failure occurs 668. A determination is made as to whether the power switch is still on 669, 670 repeatedly during this indication 668 or until initialization 601 (FIG. 5A). If the direct or over current signal is not on, however, then the indication is off for direct current or over current protection 671, the amplifier is mute 672, and a brown-out level can be determined 673. If the brown-out does not exist, then a power switch on determination is made again 674. If the power switch is on, then a determination is made as to whether a preselected number, e.g., 5 times, of direct current or over current arise 675. If such a condition did arise then the steps of 667 are repeated. If no condition did arise, then whether the direct current or over current signal turn on is made again 676. If the signal is not on, then initialization 601 occurs again. If it is on, then the process of step 665 is repeated.

Additionally, the audio amplifier further includes overvoltage and undervoltage detecting means which is preferably provided by the interface to and the software within the micro-controller U3. The signal is processed to the micro-controller U3 without the need for an external analog to digital converter ("ADC"). This is accomplished, as described above herein as well, by taking advantage of the device characteristics of the micro-controller, e.g., silicon complimentary metal oxide semiconductor or CMOS. The alternating current signal from the diode bridge rectifier circuit is delivered to pin 4 of the micro-controller U3 in analog form. The software of micro-controller, as understood by those skilled in the art, allows the micro-controller to assign a digital value to each timed portion of the input analog signal such as shown in the graph in FIG. 7, e.g., about 120 volts and 80 volts. Timing is referenced to an internal clock of the micro-controller. The software can advantageously accomplish frequency, amplitude, and input voltage "null to null" timing based on the digital replica made of the analog signal input at pin 4. The software, however, is notably independent of the micro-controller device technology. In other words, GAS, SiGe, SiC or other device technologies can be written to take advantage of this digital replication technique as well.

In essence, the software acts as a comparator to look at the crest voltage from the rectifier. The phase of the voltage is first measured and a look up table is positioned within the micro-controller, e.g., as part of software or database memory, to determine the time difference. If the crest voltage is below a certain threshold or low, then the signal is a 0, and if the crest voltage is above a certain threshold or high, then the signal is a 1.

Figure 7:
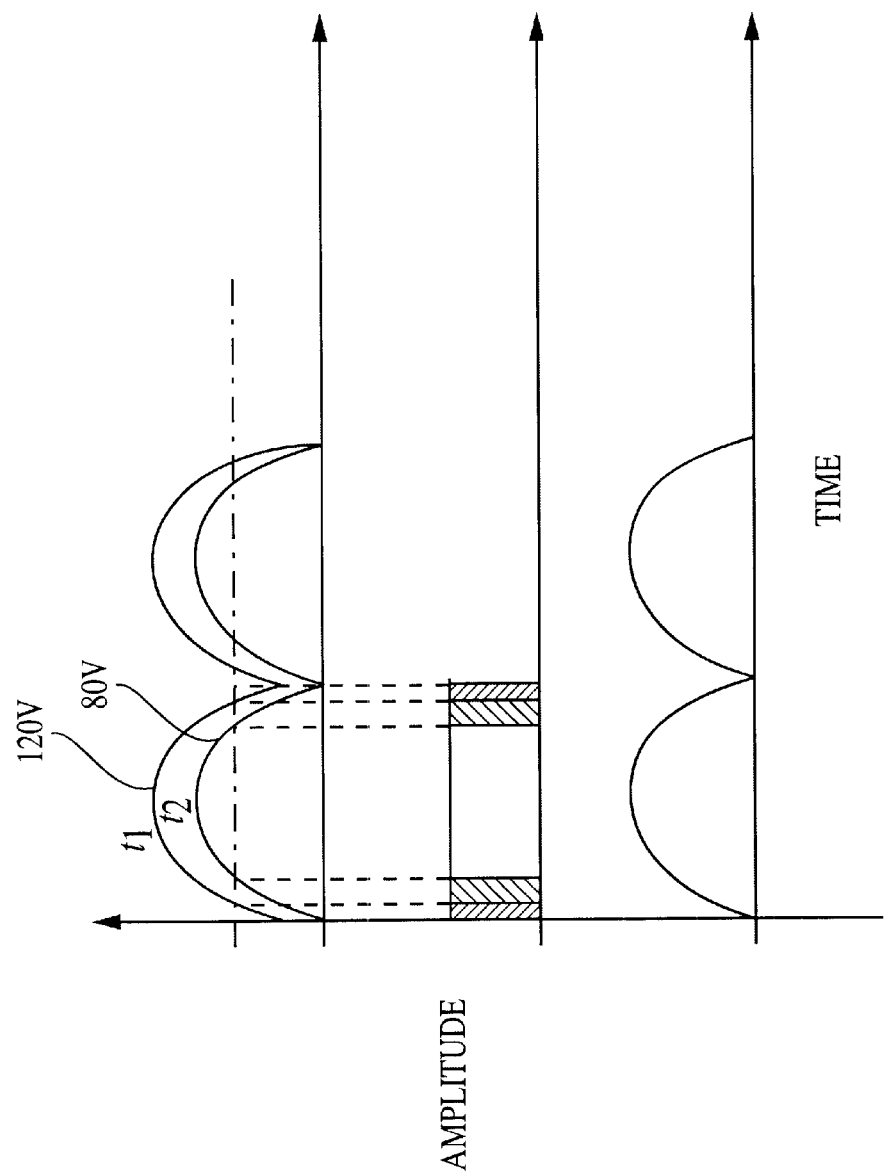
FIG. 7 is a graph of amplitude versus time for methods of controlling an audio amplifier according to the present invention.

As shown in FIG. 7, the shaded regions, t1 and t2, illustrate the difference in time used by the micro-controller U3 at the point when the voltage crosses a preselected threshold as described above. If the time is longer than t1 for about 120 volts (or other selected voltage level), then an overvoltage condition has been detected. If the time is shorter than t1 for about 120 volts (or other selected voltage), then an undervoltage condition has been detected. The same is true for t2. This digital replication or timing technique advantageously can, for example, have an accuracy margin well within 0.1%, e.g., 0.01%. This also advantageously provides flexibility to the designer and decreases the cost and overhead for the amplifier.

FIGS. 1–7, and particularly FIGS. 4A–7, illustrate methods of controlling power to an audio amplifier. A method preferably includes receiving power from a power source to an audio amplifier and switching components of an audio amplifier during a plurality of power conditions. The step of switching components preferably includes limiting inrush current from the power source, slowly ramping up to an audio amplifier on-state, monitoring thermal status of operating values of audio amplifier components, responsively decreasing power to the audio amplifier components to protect the audio amplifier components against damage caused by excess heat, and responsively increasing power when the audio amplifier components return to normal thermal operating conditions.

The method can also advantageously include the step of switching components of an audio amplifier further including monitoring current output circuits of the audio amplifier to protect the audio amplifier during a high current condition when connected to the audio amplifier by disconnecting a load to the current output circuits and reconnecting the load to the current output circuits when normal operating current conditions resume, discriminating between incoming audio component signals to turn-on the audio amplifier to the on-state and transient line voltage to momentarily sense the signal but not activating the audio amplifier to the on-state, and protectively preventing the audio amplifier from going into and remaining in a circuit protection mode by continuously monitoring the audio amplifier for normal current conditions and responsively resuming normal amplifier operations when normal current conditions occur.

The method can additionally include the step of limiting inrush current including detecting voltage changes by sensing frequency changes and voltage null points and monitoring low power conditions and high power conditions, and the step of monitoring further including monitoring the output current circuits to determine if full audio amplifier shut down is desirable to protect the audio amplifier and other system components when connected thereto. The method can further include providing visual operating and error status feedback for enhancing diagnosis of operating and error status conditions. The step of providing operating and error status feedback can include indicating at least one predetermined visual signal and displaying through a plurality of light sources light representing the at least one predetermined visual signal.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed is:

1. An audio amplifier power and temperature controller comprising:

power receiving means for receiving power from a power source to an audio amplifier; and power condition switching control means responsive to said power receiving means for switching components of an audio amplifier during a plurality of power conditions, said power condition switching control means including soft starting means responsive to said power receiving means for limiting inrush current form said power receiving means and for slowly ramping up to an audio amplifier on-state; thermal status monitoring and controlling means for monitoring thermal status of operating values of audio amplifier components and responsively decreasing g power to the audio amplifier components to protect the audio amplifier components against damage caused by excess heat and for responsively increasing power when the audio amplifier components return to normal thermal operating conditions; and output monitoring means for monitoring current output circuits of the audio amplifier to protect the audio amplifier during a high current condition when connected to the audio amplifier by disconnecting a load to the current output circuits and reconnecting the load to the current output circuits when normal operating current conditions resume;

said soft starting means in said power condition switching control means including a power level detection circuit for detecting voltage changes by sensing frequency changes and voltage null points and a micro-controller responsive to the power level detection circuit to monitor low power conditions and high power conditions.

2. An audio amplifier power and temperature controller as defined in claim 1, wherein said output monitoring means includes means for monitoring the output current circuits to determine if full audio amplifier shut down is desirable to protect the audio amplifier and other system components when connected thereto.

3. An audio amplifier power and temperature controller as defined in claim 1, wherein said power condition switching control means further includes input power discriminating means responsive to said power receiving means for discriminating between incoming audio component signals to turn-on the audio amplifier to the on-state and transient line voltage to momentarily sense the signal but not activating the audio amplifier to the on-state.

4. An audio amplifier power and temperature controller as defined in claim 1, wherein said power condition switching control means further includes brown-out protecting means for protectively preventing the audio amplifier from going into and remaining in a circuit protection mode by continuously monitoring the audio amplifier for normal current conditions and responsively resuming normal amplifier operations when normal current conditions occur.

5. An audio amplifier power and temperature controller as defined in claim 1, further comprising visual feedback means responsive to said power condition switching control means for providing visual operating and error status feedback for diagnosing operating and error status conditions.

6. An audio amplifier power and temperature controller as defined in claim 5, wherein said visual feedback means includes indicating means for indicating at least one predetermined visual signal and a plurality of light sources responsive to said indicating means to visually display light representing the at least one predetermined visual signal.

7. An audio amplifier power and temperature controller comprising:

a power receiving circuit positioned to receive power from a power source to an audio amplifier; and a power condition switching control circuit responsive to said power receiving circuit to switch components of an audio amplifier during a plurality of power conditions, said power condition switching control circuit including a soft start circuit responsive to said power receiving circuit to limit inrush current from said power receiving circuit and to slowly ramp up to an audio amplifier on-state; a thermal status monitoring and controlling circuit to monitor thermal status of operating values of audio amplifier components and responsively decrease power to the audio amplifier components to protect the audio amplifier components against damage caused by excess heat and responsively increase power when the audio amplifier components return to normal thermal operating conditions; and an output monitoring circuit to monitor current output circuits of the audio amplifier to protect the audio amplifier during a high current condition when connected to the audio amplifier by disconnecting a load to the current output circuits and reconnecting the load to the current output circuits when normal operating current conditions resume;

said soft starting circuit in said power condition switching control circuit including a power level detection circuit to detect voltage changes by sensing frequency changes and voltage null points and a micro-controller responsive to the power level detection circuit to monitor low power conditions and high power conditions.

8. An audio amplifier power and temperature controller as defined in claim 7, wherein said output monitoring circuit includes means for monitoring the output current circuits to determine if full audio amplifier shut down is desirable to protect the audio amplifier and other system components when connected thereto.

9. An audio amplifier power and temperature controller as defined in claim 7, wherein said power condition switching control circuit further includes an input power discriminating circuit responsive to said power receiving circuit for discriminating between incoming audio component signals to turn-on the audio amplifier to the on-state and transient line voltage to momentarily sense the signal but not activating the audio amplifier to the on-state.

10. An Audio amplifier power and temperature controller as defined in claim 7, wherein said power condition switching control means further includes brown-out protecting means for protectively preventing the audio amplifier from going into and remaining in a circuit protection mode by continuously monitoring the audio amplifier for normal current conditions and responsively resuming normal amplifier operations when normal current conditions occur.

11. An audio amplifier power and temperature controller as defined in claim 7, further comprising user visual feedback means responsive to said power condition switching control circuit for providing visual operating and error status feedback for diagnosing operating and error status conditions.

12. An audio amplifier power and temperature controller as defined in claim 11, wherein said visual feedback means includes indicating means for indicating at lest one predetermined visual signal and a plurality of light sources responsive to said indicating means to visually display light representing the at least one predetermined visual signal.

13. A method of controlling power for an audio amplifier, the method comprising the steps of:

receiving power from a power source to an audio amplifier; and switching components of an audio amplifier during a plurality of power conditions, the step of switching components including limiting inrush current from the power source; slowly ramping up to an audio amplifier on-state; monitoring thermal status of operating values of audio amplifier components; responsively decreasing power to the audio amplifier components to protect the audio amplifier components against damage caused by excess heat; responsively increasing power when the audio amplifier components return to normal thermal operating conditions; and monitoring current output circuits of the audio amplifier to protect the audio amplifier during a high current condition when connected to the audio amplifier by disconnecting a load to the current output circuits and reconnecting the load to the current output circuits when normal operating current conditions resume;

wherein said step of limiting inrush current includes detecting voltage changes by sensing frequency changes and voltage null points and monitoring low power conditions and high power conditions.

14. A method of controlling power for an audio amplifier as defined in claim 13, wherein said step of switching components further includes monitoring the output current circuits to determine if full audio amplifier shut down is desirable to protect the audio amplifier and other system components when connected thereto.

15. A method of controlling power for an audio amplifier as defined in claim 13, wherein said step of switching components further includes discriminating between incoming audio component signals to turn-on the audio amplifier to the on-state and transient line voltage to momentarily sense the signal but not activating the audio amplifier to the on-state.

16. A method of controlling power for an audio amplifier as defined in claim 13, wherein said step of switching components further includes protectively preventing the audio amplifier from going into and remaining in a circuit protection mode by continuously monitoring the audio amplifier for normal current conditions and responsively resuming normal amplifier operations when normal current conditions occur.

17. A method of controlling power for an audio amplifier as defined in claim 13, further comprising the step of providing visual operating and error status feedback for enhancing diagnosis of operating and error status conditions.

18. A method of controlling power for an audio amplifier as defined in claim 17, wherein the step of providing visual operating and error status feedback includes the steps of indicating at least one predetermined visual signal and displaying through a plurality of light sources light representing the at least one predetermined visual signal.

* * * * *